United States Patent
Malashevich et al.

(10) Patent No.: US 9,626,473 B2
(45) Date of Patent: Apr. 18, 2017

(54) CMOS DEVICE INCLUDING A NON-STRAIGHT PN-BOUNDARY AND METHODS FOR GENERATING A LAYOUT OF A CMOS DEVICE

(71) Applicant: FREESCALE SEMICONDUCTOR, INC., Austin, TX (US)

(72) Inventors: Denis Borisovich Malashevich, Zelenograd (RU); Viacheslav Sergeyevich Kalashnikov, Microregion Firsanovka (RU); Mikhail Yurievich Semenov, Zelenograd (RU)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/986,936

(22) Filed: Jan. 4, 2016

(65) Prior Publication Data

US 2017/0004241 A1    Jan. 5, 2017

(30) Foreign Application Priority Data

Jun. 30, 2015   (RU) ................................ 2015125998

(51) Int. Cl.
*H01L 29/06* (2006.01)
*G06F 17/50* (2006.01)
(Continued)

(52) U.S. Cl.
CPC ...... *G06F 17/5072* (2013.01); *H01L 27/0207* (2013.01); *H01L 27/092* (2013.01);
(Continued)

(58) Field of Classification Search
CPC . H01L 27/0207; H01L 27/0922; H01L 29/06; H01L 29/0684; H01L 29/0688
See application file for complete search history.

(56) References Cited

U.S. PATENT DOCUMENTS 6,477,695 B1   11/2002  Gandhi
7,089,513 B2   8/2006   Bard et al.
(Continued)

FOREIGN PATENT DOCUMENTS

EP    2133806 A1    12/2009

OTHER PUBLICATIONS

Toshiki Kanamoto, Yasuhiro Ogasahara, Keiko Natsume, Kenji Yamaguchi, Hiroyuki Amishiro, Tetsuya Watanabe, and Masanori Hashimoto, "Impact of Well Edge Proximity Effect on Timing", in: 37th European IEEE Solid State Device Research Conference, 2007, ESSDERC 2007.

(Continued)

*Primary Examiner* — Amar Movva

(57) ABSTRACT

A CMOS device comprises a substrate with a plurality of regions, the regions including an N-type region and a P-type region which meet each other in a PN-boundary, two or more P-type active regions embedded in the N-type region, and two or more N-type active regions embedded in the P-type region. The PN-boundary or a section of the PN-boundary is a chain of line segments. Any two adjoining line segments of the chain are angled relative to each other at their connecting point. The CMOS device can be designed using abutting standard cells.

For each of two or more operating points, rise delays and fall delays associated with one or more clock cells are estimated. If the estimated rise delays and fall delays satisfy a given set of constraints, the layout of the CMOS device is accepted. Otherwise the layout is updated and a new analysis round is performed.

10 Claims, 9 Drawing Sheets

(51) Int. Cl.
    *H01L 27/092* (2006.01)
    *H01L 27/02* (2006.01)
(52) U.S. Cl.
    CPC ...... *H01L 27/0922* (2013.01); *H01L 29/0684* (2013.01); *H01L 29/0688* (2013.01)

(56) References Cited

U.S. PATENT DOCUMENTS 7,737,472 B2   6/2010   Kondo et al.
8,350,365 B1   1/2013   Wu

OTHER PUBLICATIONS

Mohamed Abul Makarem, Mohamed Dessouky, and Adel El Hennawy, "Well Proximity Effects on Digital Cells Due to Context-Variability", in: Saudi International IEEE Electronics, Communications and Photonics Conference (SIECPC), 2013.

CMOS DEVICE INCLUDING A NON-STRAIGHT PN-BOUNDARY AND METHODS FOR GENERATING A LAYOUT OF A CMOS DEVICE

FIELD OF THE INVENTION

This invention relates to a CMOS device and to methods for generating a layout of a CMOS device.

BACKGROUND OF THE INVENTION

A Complementary Metal Oxide Semiconductor (CMOS) device is a Metal Oxide Semiconductor (MOS) device in which transistors are arranged in a pairwise manner, each pair (MOSFET pair) including a P-type MOSFET (Metal Oxide Semiconductor Field Effect Transistor) and an N-type MOSFET. The P-type MOSFET (PMOSFET) and the N-type MOSFET (NMOSFET) of each pair are connected so that the PMOSFET is on (conductive) when the NMOSFET is off (non-conductive) and vice versa. A CMOS device may include a large number of MOSFET pairs and, in addition, further electronic devices such as resistors, capacitors, diodes, inductors, as well as unpaired NMOSFETs or PMOSFETs.

Delay dispersion in a transistor-based clock tree can be minimized and delays can be balanced by suitably dimensioning the various transistors in each branch of the clock tree. In one approach, the active areas of the transistors are dimensioned individually, generally resulting in differently sized MOSFET pairs on the CMOS device. For example, adjacent MOSFET pairs may be geometrically different from each other. For instance, one of the two MOSFET pairs may have larger transistor areas than the other one.

In many CMOS devices, P-type field effect transistors are embedded in an N-type region of the substrate whereas N-type field effect transistors are embedded in a P-type region. When the CMOS device is implemented using a P-type substrate, the N-type region can be implemented by producing an N-type well (N-well) in the substrate, e.g., by negative doping. When an N-type substrate is used, a P-type well (P-well) can be produced, e.g., by positive doping.

The PMOSFET and the NMOSFET of a MOSFET pair can be located near each other on opposite sides of the boundary between the P-type region and the N-type region (PN-boundary). It is often desirable to ensure that there is a certain optimal distance between a transistor and the PN-boundary, for instance in order to reduce a spurious effect known as the Well Proximity Effect (WPE). This desire can be in conflict with the aim of making the CMOS device as small as possible.

A layout of a semiconductor device is a description of the semiconductor device on a computer. A layout, or a more detailed description derived from it, can be used as input data in a chip fabrication process to fabricate the semiconductor device represented by the layout. Layouts are developed by integrated circuit designers using dedicated development tools. Many such development tools are based on standard cells. A standard cell is a representation of a limited region, typically a quad-shaped region, and it may include a plurality of subregions such as doped and undoped regions, metal regions and polysilicon regions, for example. The semiconductor device can be specified to a certain degree of detail in terms of a plurality of abutting standard cells. The standard cells are usually arranged in accordance with an orthogonal lattice.

It is an object of the invention to reduce well proximity effects without increasing the size of the device, especially when there are adjacent MOSFET pairs with different dimensions. It is another object of the invention to provide a method of designing a CMOS device with reduced well proximity effects and with good use of the die area using standard cells. It is a further object of the invention to provide a method for generating a layout of a CMOS device that is to be operated at different operating points.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

In a first aspect of the invention, a PN-boundary, or a section of it, in a CMOS device is implemented as a chain of line segments, wherein any two adjoining line segments are angled relative to each other at their connecting point. The chain comprises two or more base line segments and one or more deviation line segments. The base line segments are straight lines and collinear with each other. In contrast, the deviation line segments are non-straight lines. The base line segments and the deviation line segments are connected in an alternating sequence, wherein any two adjoining base line segments are interconnected by one deviation line segment. The provision of collinear baseline segments can be beneficial for a specification of the CMOS device in terms of standard cells and further ensure that geometrical constraints, e.g., minimum distances, are satisfied. The provision of deviation line segments can be beneficial for achieving a denser packing of transistors on the substrate, especially when the transistor areas vary from one transistor to another.

In a second aspect of the invention, a method for generating a cell-based layout of a CMOS device is proposed. The method can be used to specify a PN boundary as a chain of straight and non-straight line segments, allowing for a denser packing of transistors, especially when the transistors of the CMOS device have different transistor areas.

In a third aspect of the invention, a method for generating a layout of a CMOS device is proposed, the CMOS device comprising one or more clock cells. The method allows for improving delay balancing and reducing delay dispersion.

FIGS. 1 to 5 illustrate selected examples of generic CMOS structures which can be further refined by the invention. The invention as such is illustrated by the examples of FIGS. 6 to 9.

Figure 1:
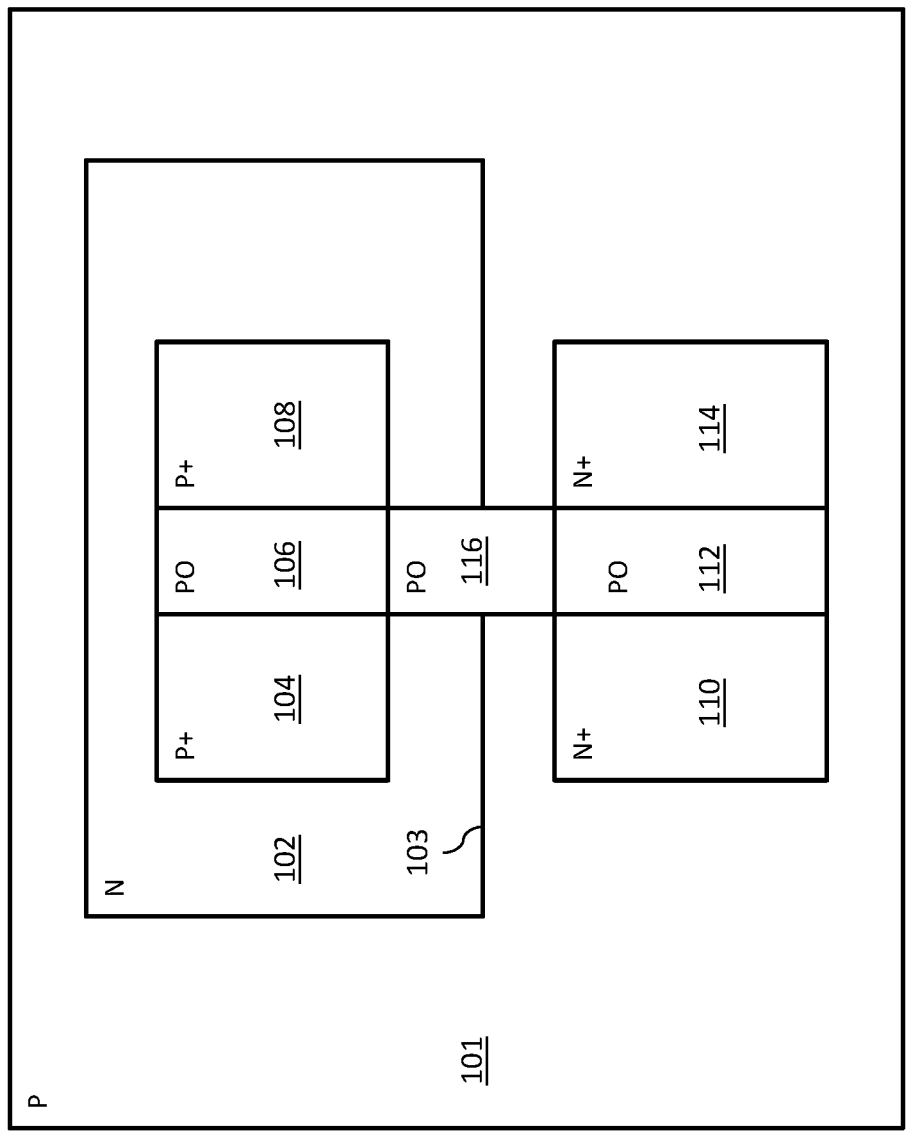
FIG. 1 schematically shows a top view of an example of a CMOS device.
Figure 2:
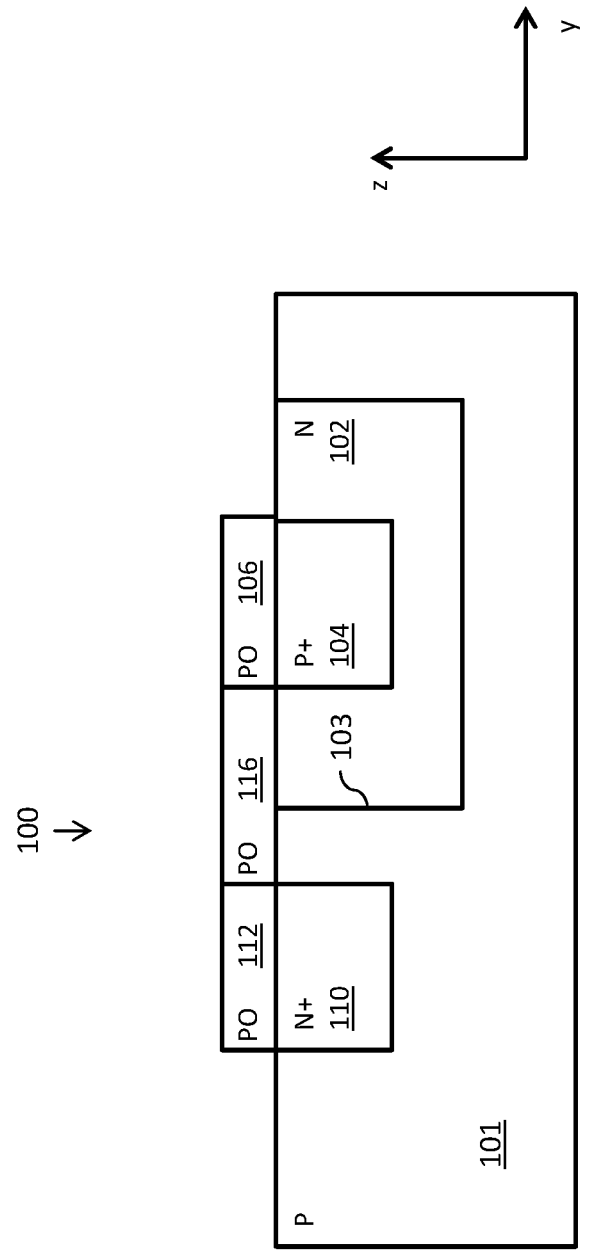
FIG. 2 schematically shows a vertical cross-section of the CMOS device from FIG. 1.

FIGS. 1 and 2 schematically show an example of a CMOS device including a substrate 100. The substrate 100 may be substantially flat and is described, for the purpose of explanation, as being parallel to a horizontal plane. FIGS. 1 and 2 show a top view and a vertical cross section of the CMOS device 100, respectively. The substrate 100 includes a P-type region 101 and an N-type region 102. In the example, the substrate 100 is of type P and the N-type region 102 is formed as an N-well embedded in the substrate. The N-well can have a substantially rectangular horizontal cross section, as shown.

Embedded in the N-type region 102 is a PMOSFET 104, 106, 108. The PMOSFET includes a source 104, a gate 106, and a drain 108. The source 104 and the drain 108 may each be implemented as a doped region of type P+. The gate 106 may be implemented as a conductive or semi-conductive region between the source 104 and the drain 108. The gate 106 may, for example, be formed of polysilicon (PO) or metal.

Embedded in the P-type region 101. The NMOSFET 110, 112, 114 may have a geometry that is generally similar to that of the PMOSFET 104, 106, 108. The NMOSFET includes a source 110, a gate 112, and a drain 114, wherein the gate 112 is the region located between the source 110 and the drain 114. The source 110 and the drain 114 may each be a doped region of type N+. The gate 112 may be formed of a conductive or semi-conductive material, e.g., a metal or polysilicon.

The drain 108 of the PMOSFET and the drain 114 of the NMOSFET are conductively connected, e.g., by a conductive bridge located on top of the substrate and which is not illustrated in the drawings. The drains 108 and 114 can thus provide a common output of the MOSFET pair formed of the PMOSFET 104, 106, 108 and the NMOSFET 110, 112, 114. The gates 106 and 112 are connected to each other by a conductive or semi-conductive region 116 (gate connecting region). The gates 106 and 112 and the gate connecting region 116 can be implemented as one coherent region of the same material, e.g., polysilicon.

The sources 104 and 110 of the PMOSFET and the NMOSFET can be connected to the terminals of a DC power supply (not shown). The PMOSFET 104, 106, 108 and the NMOSFET 110, 112, 114 can thus be operated as an inverter, the connected gates 106 and 112 serving as an input and the connected drains 108 and 114 serving as an output.

Figure 3:
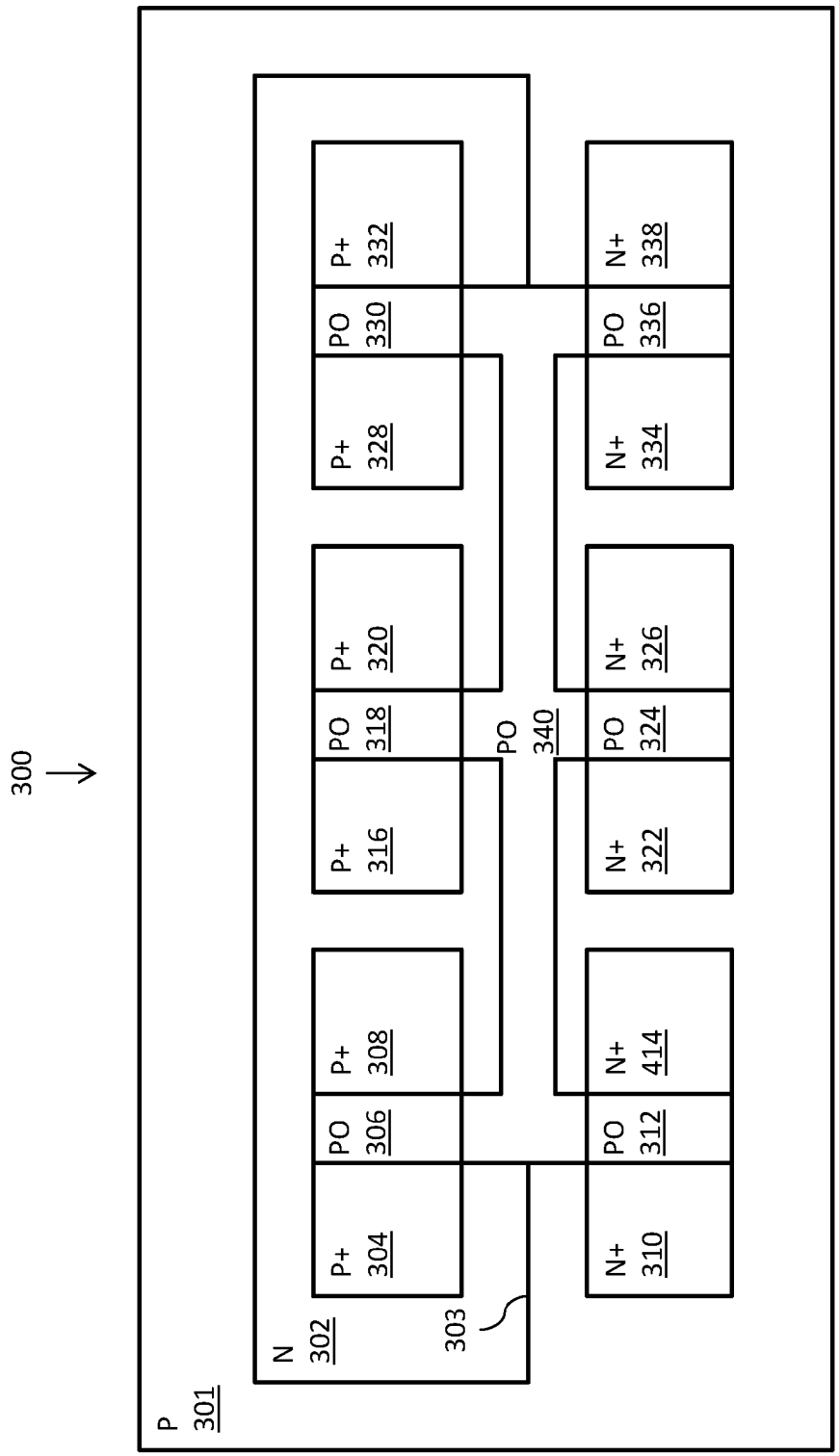
FIG. 3 schematically shows a top view of an example of a CMOS device.

In the example of FIG. 3, a substrate 300 of a CMOS device includes a set of three MOSFET pairs with interconnected gates that can serve as a common input. The MOSFET pairs may, for example, be the initial segments of three clock signal branches that branch off from the common input. More specifically, the substrate 300 includes a first, a second, and a third MOSFET pair with gate regions 306, 312, 318, 324, 330, and 336, source regions 304, 310, 316, 322, 328, 334, and drain regions 308, 314, 320, 326, 332, 338. Source regions and drain regions, which are often the most heavily doped regions in a substrate, are also referred to herein as the active regions. The P-type active regions 304, 308, 316, 320, 328, 332 are embedded in an N-type region 302 of the substrate 300. The N-type active regions 310, 314, 322, 326, 334, 338 are embedded in a P-type region 301 of the substrate 300. In the example, the first PMOSFET 304, 306, 308, the second PMOSFET 316, 318, 320, and the third PMOSFET 328, 330, 332 are arranged in a first row while the first NMOSFET 310, 312, 314, the second NMOSFET 320, 324, 326, and the third NMOSFET 334, 336, 338 are arranged in a second row parallel to the first row. The shown arrangement can readily be extended to substrates including more than three MOSFET pairs. That is, more than three MOSFET pairs can be arranged in two parallel adjacent rows. In the example, the gates of the NMOSFETs and PMOSFETs are interconnected by a gate connecting region 340, which may be formed of the same material as the gates, e.g., polysilicon (PO) or a metal.

Figure 4:
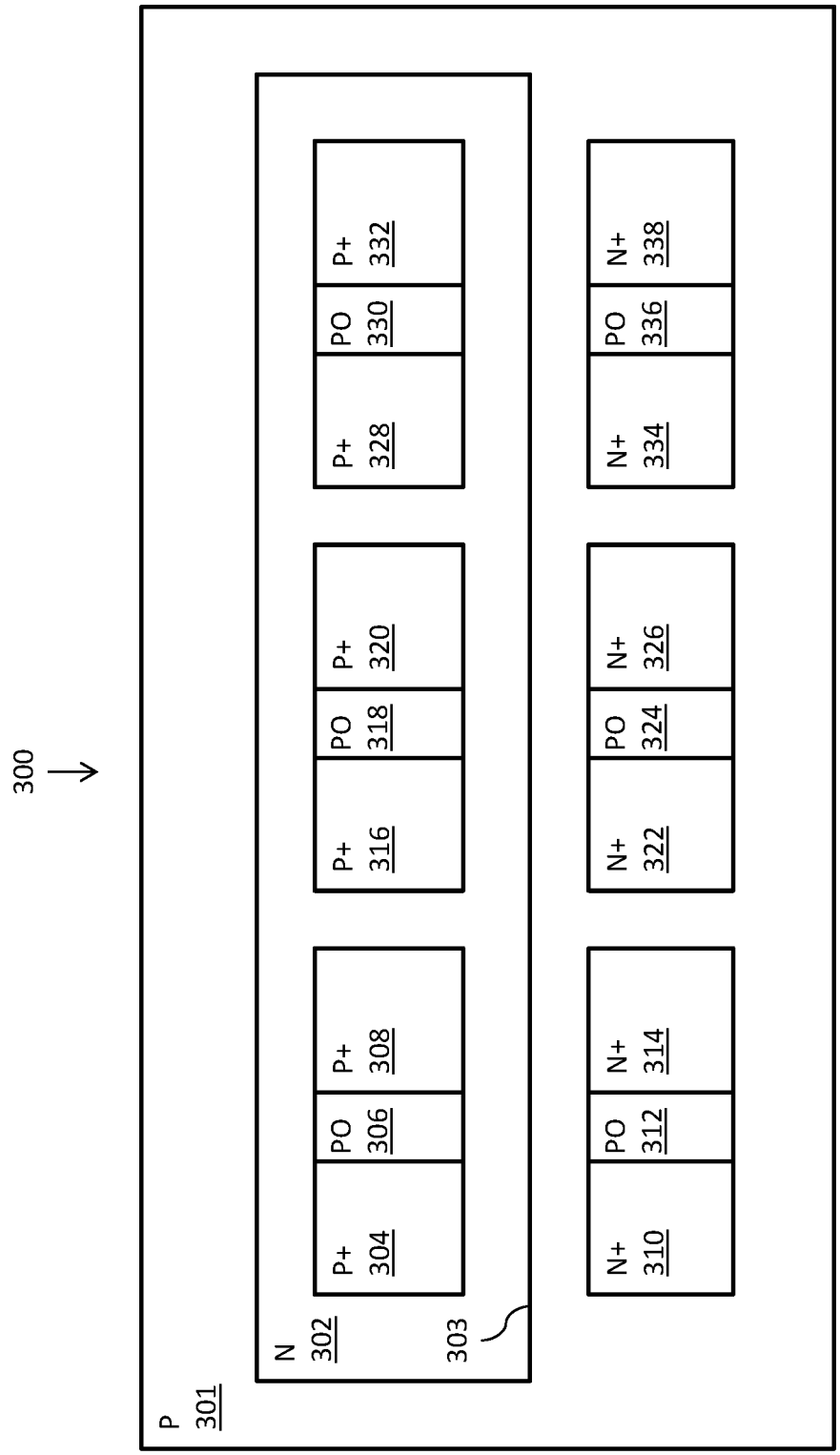
FIG. 4 gives a simplified view of the top view from FIG. 3.

FIG. 4 shows a simplified version of FIG. 3, in which the gate connecting region 340 is not shown so as to reveal the complete PN-boundary 303. As shown, the N-type region 302 can be rectangular and aligned with the rows of PMOSFETs and NMOSFETs. Accordingly, the section of the PN-boundary 303 that runs between the row of PMOSFETs and the row of NMOSFETs can be a straight line.

As will be described further below with reference to FIGS. 6 to 7, a more flexible layout, in which the section of the PN-boundary that is located between a row of PMOSFETs and an adjacent row of NMOSFETs deviates from a straight line, can be of advantage.

Figure 5:
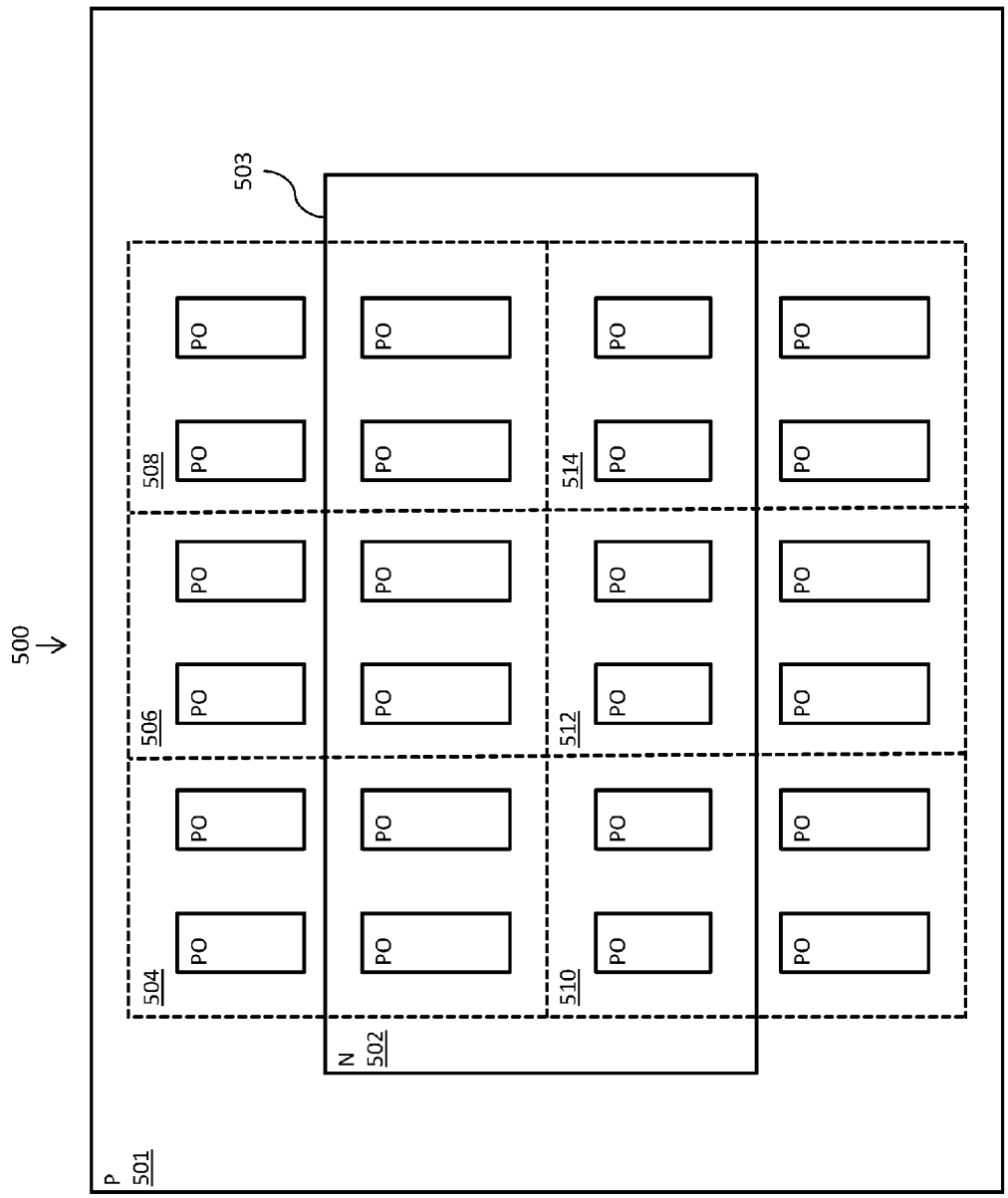
FIG. 5 schematically shows an example of a layout of a CMOS device including a plurality of standard cells.

FIG. 5 schematically shows an example of a substrate 500 including a P-type region 501 in which an N-type region 502 is embedded. The substrate 500 includes a plurality of MOSFET pairs arranged in two adjacent rows. In the example, there are twelve MOSFET pairs, six of them located in an upper row, six of them in a lower row. For the sake of simplicity, their sources and drains are not shown. Their gates are labeled PO. In a development stage, the substrate 500 can be specified in terms of standard cells. In the example, standard cells 504, 506, 508, 510, 512, and 514 are shown. It is recalled that the Figure shows a top view of the substrate 500. It should therefore be noted that each standard cell defines a three dimensional quad-shaped region, although this is not apparent from the Figure alone.

As shown, each of the standard cells 504 to 514 includes a segment of the PN-boundary 503. The PN-boundary 503 can be subject to periodic boundary conditions in each standard cell. That is, the position of the PN-boundary 503 on the left edge and its position on the right edge of the respective standard cell can be chosen identical. Continuity of the PN-boundary 503 across abutting standard cells can thus be ensured with low computational effort. In the example, each of the standard cells 504 to 514 includes a straight (i.e. linear) segment of the PN-boundary 503.

Figure 6:
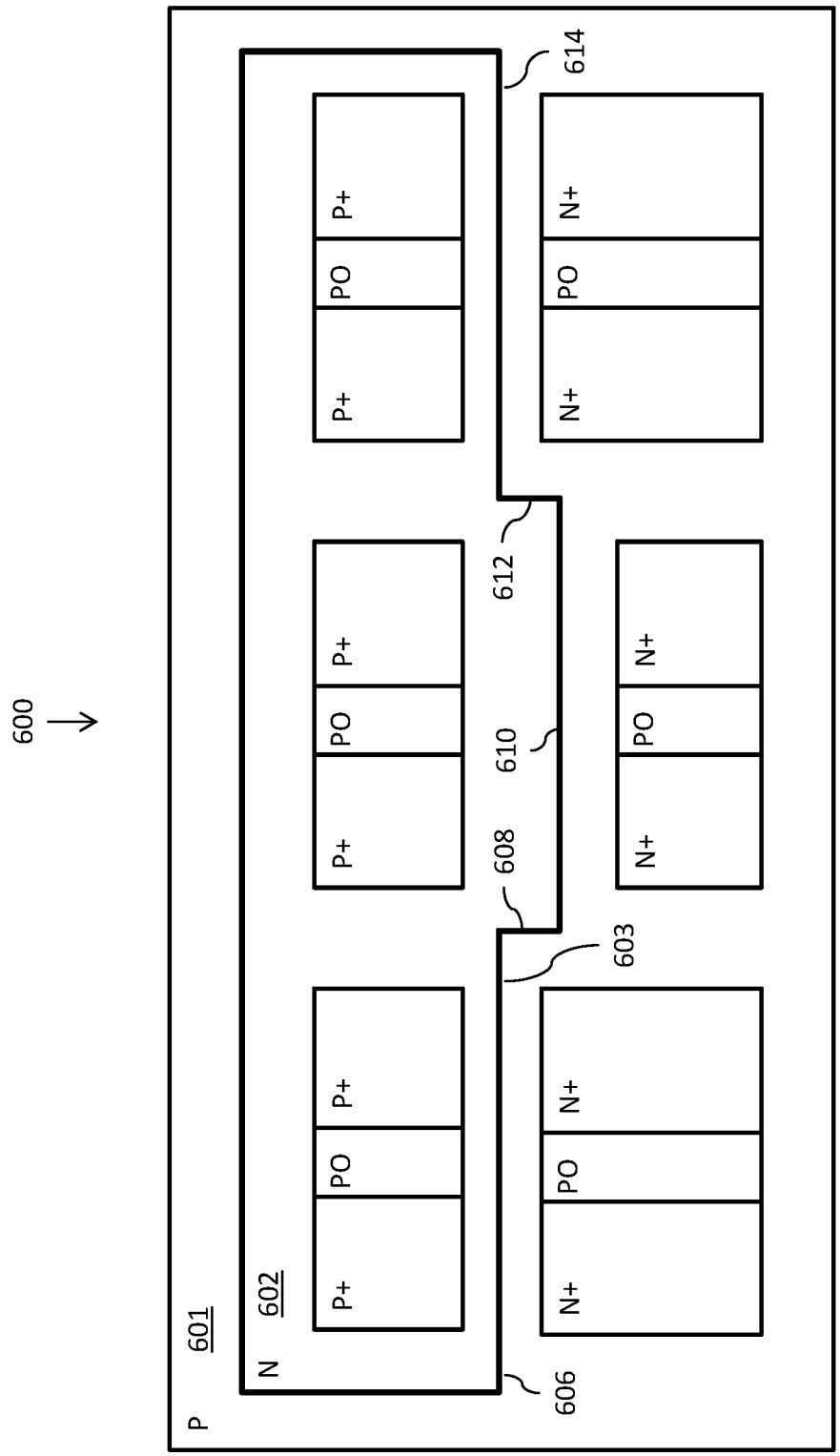
FIG. 6 schematically shows a top view of an example of a CMOS device.

Referring now to FIG. 6, a substrate 600 representing an example of a modified version of the substrate 300 from FIGS. 3 and 4, is shown. In the example, the NMOSFETs, located inside the P-type region 601, vary in size and shape. As explained above, certain optimal distances between the PN-boundary and active areas can be beneficial. At the same time, it is desirable to pack the active areas as densely as possible in order to minimize the used area on the substrate. A compromise between these conflicting aims can be achieved by providing a PN-boundary (the PN-boundary 603 in the example) that deviates from a straight line in the region between two adjacent rows of active areas. The deviations can be defined, for example, as a function of the particular geometry of the active areas, e.g., using known technology rules.

The substrate 600, like the substrates described above with reference to FIGS. 1 to 5, may be substantially flat and is described herein as substantially parallel to a horizontal plane. The substrate 600 includes a plurality of regions located at different horizontal positions in the substrate 600. The regions include the P-type region 601 and the N-type region 602, which meet each other in the PN-boundary 603, two or more P-type active regions embedded in the N-type region 602, and two or more N-type active regions embedded in the P-type region 601. A section of the PN-boundary 603, namely the section located between the rows of P-type active regions and the N-type active regions, is a chain of line segments 606, 608, 610, 612, and 614. Any two adjoining line segments of the chain 606, 608, 610, 612, 614 are angled relative to each other at their respective connecting point. Here and throughout the specification, two lines are said to be angled when they meet each other with a mutual angle of between 30 degrees and 150 degrees (or, equivalently, between 210 degrees and 330 degrees). In the example, the chain of line segments 606, 608, 610, 612, and 614 includes two base line segments 606 and 614 and one deviation line segment formed of the line segments 608, 610, and 612. More generally, the chain may include two or more base line segments and one or more deviation line segments. The base line segments 606 and 614 are straight lines and collinear with each other, i.e. located on a common straight line. The deviation line segment 608, 610, 612 is a non-straight line, e.g., a polygonal line, a curved line, or a combination of both (e.g., a chain of curved segments which are angled to each other at their connecting points). More generally, the base line segments and the deviation line segments are connected in an alternating sequence, any two adjoining base line segments being interconnected by one deviation line segment, wherein the base line segments are straight (i.e. linear) lines and collinear with each other and the deviation line segments are non-straight (i.e. non-linear) lines. The precise shapes, sizes, and positions of the various line segments of the PN-boundary 603 can be computed using known circuit design constraints and optimization principles, e.g., as implemented in a variety of integrated circuit design tools. The introduction of one or more deviation line segments in the sequence of collinear base line segments allows for a better use of the available substrate area, in particular when constraints aiming at keeping well-proximity effects below a certain threshold are involved.

In the example, the deviation line segment 608, 610, 612 is a chain of three straight line segments 608, 610, 612. More generally, when there are one or more deviation line segments, each of them may be a chain of straight line segments. This can be beneficial both in a design and in a fabrication stage. Notably, each of the deviation line segments may consist of a first, a second, and a third straight line segment which are connected in this order, wherein the first and the third straight line segments (e.g., the segments 608 and 612) are angled relative to the base line segments and wherein the second straight line segment (e.g., the segment 610) is parallel to but not in line with the base line segments.

As illustrated by the example of FIG. 6, and also more generally, the two or more P-type active regions may be arranged in a first row and the two or more N-type active regions may be arranged in a second row parallel to the first row. The two or more base line segments (e.g., the segments 606 and 614) can be parallel to the first row and the second row. The two or more P-type active regions and the two or more N-type active regions may be arranged in pairs, each pair consisting of a P-type active region and an N-type active region, which are located near each other on opposite sides of the PN-boundary. As illustrated by the example of FIG. 6, these pairs may include a first pair and an adjacent second pair, wherein the first pair and the second pair differ from each other substantially in one or more of shape and size.

Figure 7:
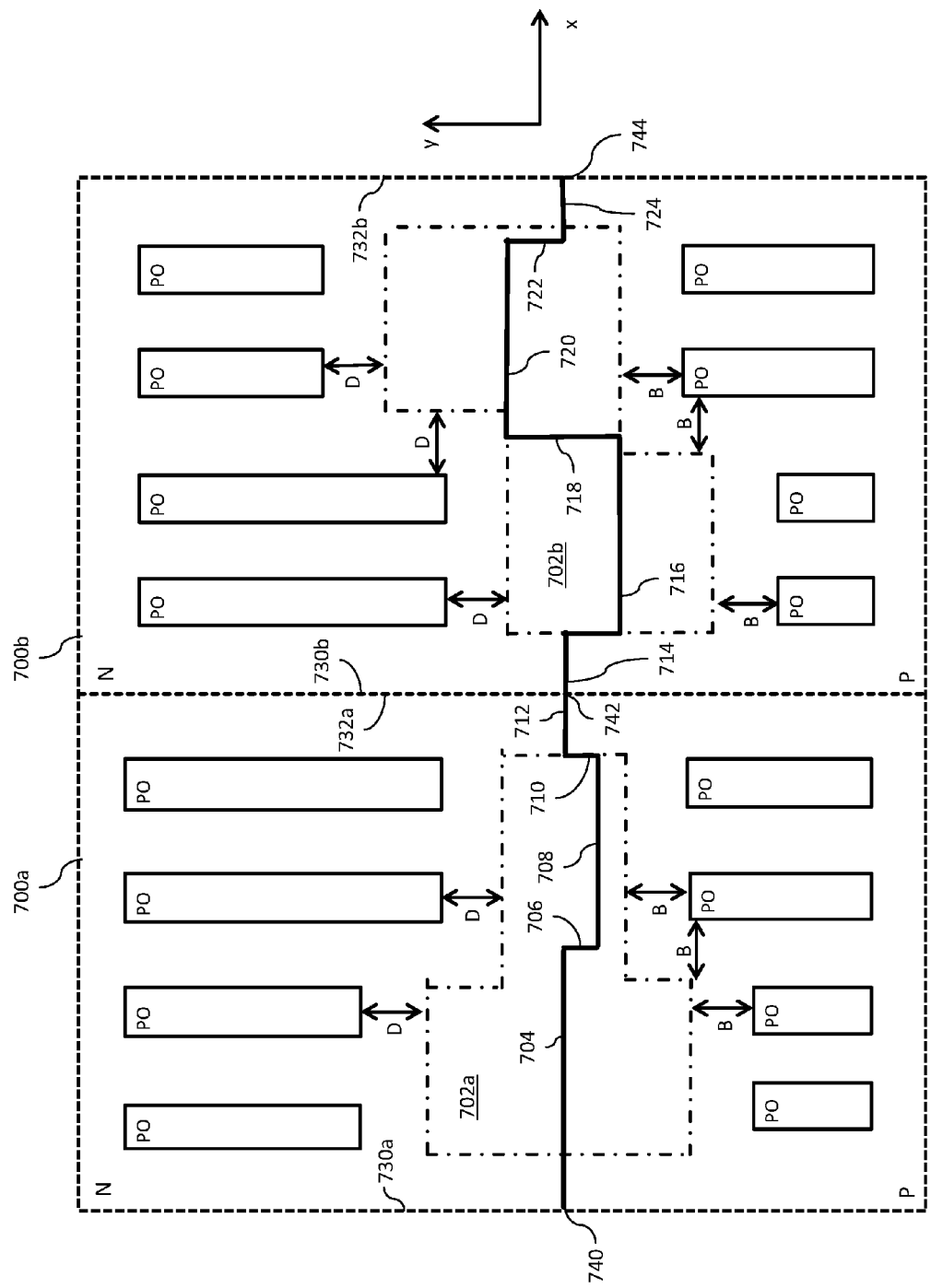
FIG. 7 schematically shows a top view of two abutting standard cells.

A method for generating a layout of a CMOS device is described by making additional reference to FIG. 7. The CMOS device includes a substrate similar to the substrates explained above with reference to FIGS. 1 to 6. Active regions in the substrate are not shown for the sake of simplicity. NMOSFETs and PMOSFETs are represented schematically by their gates (labeled PO in the figure).

The method includes specifying a row of two or more abutting standard cells, e.g., standard cells 700a and 700b (represented by dashed lines in FIG. 7). The standard cells have rectangular contours and are flush with each other. Each of the standard cells, e.g., 700a and 700b, includes a section of a PN-boundary (e.g., the bold line connecting the points 740 and 744) which traverses the respective standard cell from a left cell edge (e.g., left cell edges 730a and 730b, respectively) to a right cell edge (e.g., right cell edges 732a and 732b, respectively).

The points (e.g., 740, 742, 744) at which the PN-boundary meets the left cell edges (e.g., the left cell edges 730a and 730b) and the points at which it meets the right cell edges (e.g., the right cell edges 732a and 732b) form a series of base points located on a straight line parallel to the row direction (e.g., the x-direction). In each of the base points, the PN-boundary runs parallel to the row direction. This geometrical constraint on the PN-boundary is compatible with a conventional placement of N-type and P-type active areas on both sides of the PN-boundary. Furthermore, it ensures continuity of the PN-boundary across cell edges and can thus reduce the computational effort for defining the PN-boundary.

The method further includes, for each of one or more standard cells of the row (e.g., for both standard cells 700a and 700b) specifying the respective section of the PN-boundary as a chain of two or more line segments, wherein any two adjoining line segments of the chain are angled relative to each other at their connecting point, e.g., by 90 degrees, i.e. orthogonally. Angles other than 90 degrees, e.g., 45 degrees or 135 degrees, are also possible, at least in principle. In practice, circuit design tools and chip fabrication plants are often limited to rectangular patterns. In the example, the section of the PN-boundary in the first standard cell 700a, i.e. the section from the base point 740 to the base point 742, is specified as a chain of line segments 704, 706, 708, 710, and 712. Similarly, the section of the PN-boundary in the standard cell 700b, i.e. the section from the base point 742 to the base point 744, is specified as the chain of line segments 714, 716, 718, 720, 722, and 724.

The chain of line segments in each standard cell (e.g., each of the chains 704 to 712 and 714 to 724) includes a left base line segment (e.g., the line segments 704 and 714, respectively) starting from the left cell edge (e.g., the left cell edges 730a and 730b, respectively) and oriented parallel to the row direction (e.g., the x-direction) and a right base line segment (e.g., the base line segments 712 and 724, respectively) starting from the right cell edge (e.g., the right cell edges 732a and 732b, respectively). The provision of such base line segments can be beneficial for ensuring a certain minimum distance from the PN-boundary in a given cell to the active regions in an abutting cell. For instance, the base line segment 712 in FIG. 7 ensures a certain distance between any point of the PN-boundary inside the standard cell 700a and any active area inside the abutting standard cell 700b provided that the active areas in the standard cell 700b are placed at some distance from the borders of the standard cell 700b, i.e. learning a margin in the standard cell.

This is an example of using internal constraints of a standard cell (i.e. constraints which do not involve any other standard cells) to ensure that inter-cell constraints (i.e. constraints involving two or more standard cells, e.g., constraints on the distance between elements of neighbouring cells) are met. Each base line segment may be constrained to have a certain minimum length. This minimum length may, for example, be the minimum admissible distance between the PN-boundary and any active region. In practice, each base line segment may have a minimum length of, e.g., between 1 nanometer and 100 micrometers.

Each standard cell of the row (e.g., each of standard cells 700a and 700b) may include a PN-boundary definition region which is spaced apart from the edges of the standard cell. The minimum required distance between the PN-boundary definition region and the edges of the standard cell can be set identical to the minimum required length of the base line segments. The above mentioned act of specifying the respective section of the PN-boundary as a chain of line segments may include confining the chain of line segments to the PN-boundary definition region of the respective standard cell. The PN-boundary definition region may, for example, occupy between zero percent (0%), in which case the PN-boundary definition region is a straight line, and eighty percent (80%) of the area of the standard cell. For computational simplicity, the PN-boundary definition region can be a polygonal region, e.g., a rectangle. The PN-boundary definition region may differ from one standard cell to another one.

In the example of FIG. 7, the standard cell 700a includes a polygonal PN-boundary definition region 702a (i.e. the region delimited by the two dot-dashed lines). The PN-boundary definition region may, for instance, be specified in terms of distances B and D, wherein B and D are the minimum admissible distances between the PN-boundary definition region and the P-type and the N-type active regions, respectively. B and D may be equal or different. The standard cell 700b of the example similarly includes a polygonal PN-boundary definition region 702b. In each boundary definition region, the line segments of the PN-boundary can be suitably defined on the basis of a specification of active areas located on both sides of the PN-boundary in the respective standard cell, or, more generally, as a function of further elements or characteristics of the standard cell.

In each standard cell, the line segments of the PN-boundary may be straight line segments. Defining the PN-boundary as a chain of straight line segments can reduce the computational effort and simplify fabrication. Alternatively, the PN-boundary may include one or more curved line segments. Curved line segments can be more challenging in computation and fabrication but may allow for a further reduction in chip size.

For example, the chain of line segments defining the PN-boundary in each standard cell may consist of precisely five straight line segments. Any two adjoining ones of these five straight line segments may be orthogonal to each other. In the example of FIG. 7, the PN-boundary in the standard cell 700a consists of the five straight line segments 704, 706, 708, 710, 712. Thus a compromise between computational effort and geometric degrees of freedom can be achieved.

Figure 8:
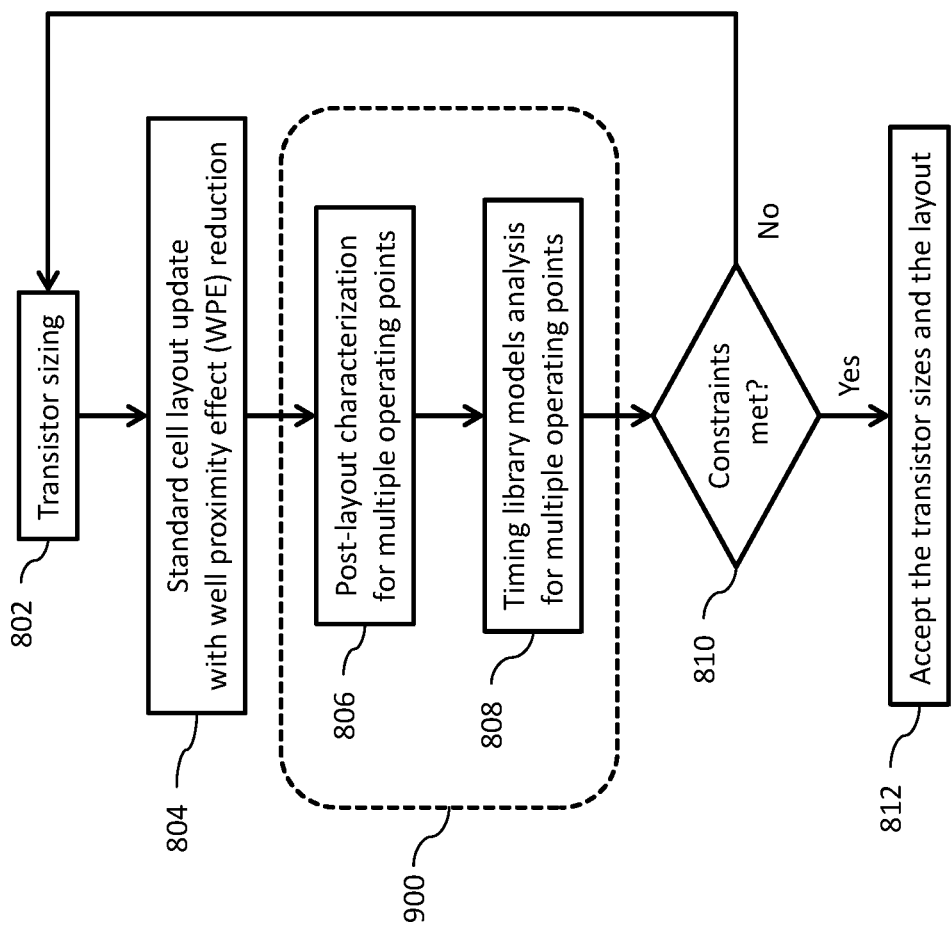
FIG. 8 shows a flow chart of an example of a method of generating a layout of a CMOS device.

The flow chart in FIG. 8 schematically illustrates an example of a method for generating a layout of a CMOS device. The CMOS device includes one or more clock cells, each clock cell having a rise delay and a fall delay associated with it. Each clock cell may, for example, be implemented as an inverter, a set of inverters connected in series, or a more complex logic cell. The method includes: specifying one or more constraints on the rise delays and fall delays of the one or more clock cells; specifying two or more operating points, wherein each operating point is a point in a space of one or more operating variables; and determining a valid layout of the CMOS device in a series of one or more analysis rounds. For example, the one or more constraints may define, for each of the clock cells, one or more of a maximum allowed rise delay, a maximum allowed fall delay, and an allowed range of the delay balance of the respective clock cell. The operating variables may include, for example, one or more of a supply voltage, a temperature, and one or more process spread variables. Process spread variables are quantities that may vary from one device to another device as a consequence of fabrication variations. Process spread variables may, for example, include doping concentrations or geometrical properties.

Each analysis round can include: specifying a trial layout of the CMOS device different from the trial layouts of any preceding analysis rounds of the series; for each of the two or more operating points, estimating the rise delays and the fall delays associated with the one or more clock cells on the basis of the trial layout; determining whether the estimated rise delays and fall delays satisfy the one or more constraints; initiating a next analysis round if the estimated rise delays and fall delays do not satisfy the one or more constraints; and accepting the trial layout as a final layout if the estimated rise delays and fall delays satisfy the one or more constraints.

The trial layout can define a substrate of the kind described above with reference to FIGS. 1 to 7. Accordingly, the substrate can include an N-type region and a P-type region which meet each other in a PN-boundary, two or more P-type active regions embedded in the N-type region, and two or more N-type active regions embedded in the P-type region. The PN-boundary or a section of the PN-boundary can be designed as a chain of line segments, wherein any two adjoining line segments of the chain are angled relative to each other in their connecting point. The chain of line segments can include two or more base line segments and one or more deviation line segments, wherein the base line segments are straight lines and collinear with each other and the deviation line segments are non-straight lines. The base line segments and the deviation line segments are connected in an alternating sequence, in which any two adjoining base line segments are interconnected by one deviation line segment. The series of analysis rounds can include an initial round and a later round, wherein the trial layout of the later round differs from the trial layout of the initial round at least in one of the deviation line segments.

In the example, the method starts with defining a size of each of a plurality of transistors on the substrate (802). For example, the x- and y-dimensions of each transistor may be individually set while the z-dimension of the transistor may be the same for all transistors. A standard cell layout of the substrate can then be updated (804) as a function of the transistor sizes. The layout can then be evaluated numerically (900). For example, a post-layout characterization for multiple operating points can be carried out (806). Next, still as part of the operation 900, timings for multiple operating points can be computed, e.g., using a timing library model analysis (808). Based on the results obtained from the numerical evaluation in the operation 900, it can then be determined whether the constraints are met. In this case, the transistor sizes and the layout can be accepted (812). Otherwise, they are rejected and a new analysis round can be performed based on new transistor sizes.

Figure 9:
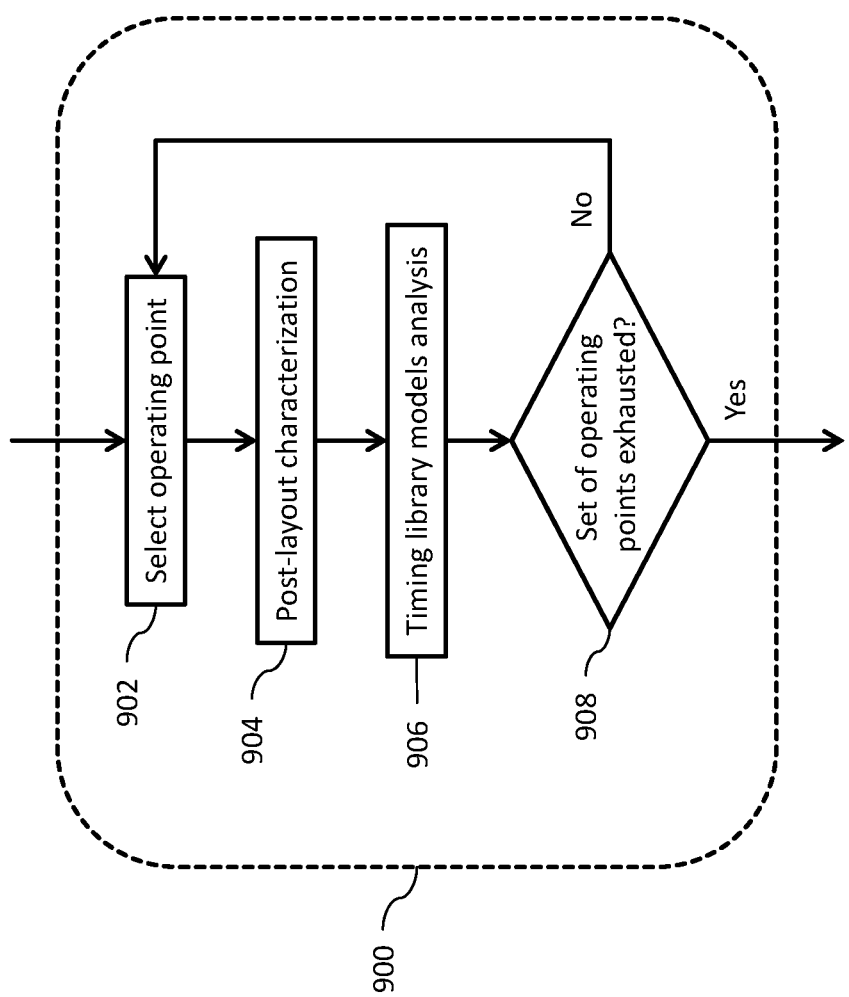
FIG. 9 shows a flow chart of a detail of a variant of the method from FIG. 8.

FIG. 9 shows a variant of the method in which the operation 900 from FIG. 8 is implemented differently. In the example, when the transistor sizes have been specified, an operating point in the space of operating variables is selected (902). A post-layout characterization (904) and a timing library models analysis (906) are then carried out for the selected operating point. It is then determined whether further operating points shall be selected, i.e., it is determined whether the set of operating points of interest is exhausted or not (908). If the set is exhausted, the method continues with the operation 810 described above with reference to FIG. 8. Otherwise, another operating point is selected (902) and operations 904 and 906 are carried out for the newly selected operating point.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

In the foregoing specification, the invention has been described with reference to specific examples of embodiments of the invention. It will, however, be evident that various modifications and changes may be made therein without departing from the broader spirit and scope of the invention as set forth in the appended claims.

The semiconductor substrate described above can be any semiconductor material or combinations of materials, such as gallium arsenide, silicon germanium, silicon-on-insulator (SOI), silicon, monocrystalline silicon, the like, and combinations of the above.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, any reference signs placed between parentheses shall not be construed as limiting the claim. The words "include" or "comprise" do not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A CMOS device comprising a substrate, which comprises a plurality of regions, the regions including
    an N-type region and a P-type region which meet each other in a PN-boundary;
    two or more P-type active regions embedded in the N-type region; and
    two or more N-type active regions embedded in the P-type region, wherein
        the PN-boundary or a section of the PN-boundary is a chain of line segments,
        any two adjoining line segments of the chain are angled relative to each other at their connecting point,
        the chain comprises two or more base line segments and one or more deviation line segments,
        the base line segments are straight lines and collinear with each other and the deviation line segments are non-straight lines,
        the base line segments and the deviation line segments are connected in an alternating sequence, and
        any two adjoining base line segments are interconnected by one deviation line segment.

2. The CMOS device of claim 1, wherein the substrate is substantially flat and described herein as substantially parallel to a horizontal plane and said regions are located at different horizontal positions in the substrate.

3. The CMOS device of claim 1, wherein each of the deviation line segments is a chain of straight line segments.

4. The CMOS device of claim 1, wherein each of the deviation line segments consists of a first, a second, and a third straight line segment connected in this order, wherein the first and third straight line segments are angled relative to the base line segments and wherein the second straight line segment is parallel to but not in line with the base line segments.

5. The CMOS device of claim 1, wherein the two or more P-type active regions are arranged in a first row and the two or more N-type active regions are arranged in a second row parallel to the first row, and wherein the two or more base line segments are parallel to the first row and the second row.

6. The CMOS device of claim 1, wherein the two or more P-type active regions and the two or more N-type active regions are arranged in pairs, each pair consisting of a P-type active region and an N-type active region which are located near each other on opposite sides of the PN-boundary.

7. The CMOS device of claim 6, wherein said pairs comprise a first pair and an adjacent second pair, wherein the first pair and the second pair differ from each other substantially in one or more of shape and size.

8. The CMOS device of claim 7, comprising one or more logic cells, each logic cell comprising two adjacent ones of said pairs of P-type and N-type active regions.

9. The CMOS device of claim 8, wherein the one or more logic cells are part of a clock path.

10. The CMOS device of claim 1, wherein the substrate is of type P and the N-type region is an N-type well, or wherein the substrate is of type N and the P-type region is a P-type well.

* * * * *